May 3, 1960 C. F. AULT 2,935,696

WIDE-BAND AMPLIFIERS

Filed April 23, 1958 2 Sheets-Sheet 1

INVENTOR.
CYRUS FRANK AULT
BY Darby & Darby
ATTORNEYS.

WIDE-BAND AMPLIFIERS

Filed April 23, 1958 2 Sheets-Sheet 2

INVENTOR.
CYRUS FRANK AULT
BY Darby + Darby
ATTORNEYS.

United States Patent Office 2,935,696 Patented May 3, 1960

2,935,696

WIDE-BAND AMPLIFIERS

Cyrus Frank Ault, Clifton, N.J., assignor to Allen B. Du Mont Laboratories, Inc., Clifton, N.J., a corporation of Delaware Application April 23, 1958, Serial No. 730,309

11 Claims. (Cl. 330—124)

This invention relates to amplifiers and more particularly to so-called "wide-band" amplifiers.

The term "wide-band" amplifier generally refers to an amplifier having a substantially constant voltage or current gain over a wide range of applied signal frequencies. In evaluating the performance of such an amplifier, the voltage or current gain of the amplifier is plotted as a function of the applied signal frequency, to yield the frequency response characteristic of the amplifier. The gain of the amplifier is substantially constant over the "flat" portion of the frequency response characteristic curve as conventionally measured between the 3 db. down points.

Wide-band amplifiers are employed in many applications, such as the video amplifier in television systems and the deflection amplifier in cathode-ray oscilloscopes. The flat frequency response requirements of deflection amplifiers for cathode-ray oscilloscopes are particularly severe, since the amplifiers must usually respond to applied signal frequencies ranging from zero (D.C.) to several hundred megacycles. If the deflection amplifiers do not have a flat frequency response characteristic over the required range of applied signal frequencies, the wave shape of the signals applied to the deflecting elements of the oscilloscope will be distorted. For example, an applied square wave is composed of a fundamental frequency and many harmonic frequencies, all of which must be amplified with the same gain and without appreciable relative phase shift if the square wave shape is to be accurately reproduced by the oscilloscope. Should the low frequency components of the square wave be attenuated with respect to the high frequency components, the reproduced square wave will have a top portion which is "dished." Similarly, if the high frequency components of the square wave are attenuated relative to the low frequency components, the corners of the square wave will become rounded and the normally flat top of the wave may have a "ripple" effect.

In designing wide-band amplifiers, it has been found that the size of the coupling capacitor materially affects the low frequency response of the amplifier. If a small coupling capacitor is employed, the gain of the amplifier is materially reduced for low frequency applied signals. When the size of the coupling capacitor is increased to offset this, however, the gain-per-stage of the amplifier is reduced, due to the well known voltage divider effect, so that a multi-stage amplifier is usually required to obtain both the required gain and a satisfactorily flat frequency response characteristic. Furthermore, wide-band amplifiers having a suitable low frequency response, such as to D.C., for example, usually suffer from excessive tube losses and large power supply requirements, due to the D.C. coupling needed. While attempts have been made to share the desired frequency response by combining amplifiers possessing the required low and high frequency responses, the results obtained have been generally unsatisfactory, since the combined amplifiers tend to oscillate in the region where the individual frequency responses of the amplifiers overlap.

Accordingly, it is an object of this invention to provide a wide-band amplifier having low tube losses and small power supply requirements.

It is a further object of this invention to provide a wide-band amplifier which is suitable for use as the deflection amplifier in a cathode-ray oscilloscope.

It is a still further object of this invention to provide a wide-band amplifier which combines two amplifiers having the required low and high frequency responses, without incurring oscillation in the region where the individual frequency responses of the amplifiers overlap.

Briefly, the wide-band amplifier of the invention comprises an A.C. amplifier having a flat frequency response characteristic over a first range of applied signal frequencies and a D.C. difference amplifier having a much greater gain than the A.C. amplifier over a second range of applied signal frequencies extending from D.C. to the low frequency limit of the first range. The two amplifiers are arranged so that the A.C. amplifier satisfactorily amplifies the higher applied signal frequencies with a substantially constant gain and the D.C. amplifier amplifies the lower signal frequencies in a manner to maintain a substantially constant gain for the wide-band amplifier over a range of applied signal frequencies extending from D.C. to the high frequency limit of the first range. In order to prevent oscillation from occurring in the region of operation where the individual frequency responses of the two amplifiers overlap, frequency responsive attenuating means are included in the coupling between the output of the A.C. amplifier and the output of the wide-band amplifier. The attenuating means functions to attenuate the output signals from the A.C. amplifier for applied signal frequencies lower than a frequency lying in the first range of frequencies near the low frequency limit.

In one embodiment of the invention, the D.C. difference amplifier is effectively coupled in parallel circuit with the A.C. amplifier between the input and output of the wide-band amplifier. One of the inputs of the difference amplifier is coupled to the input of the wide-band amplifier and the other input is coupled to the output of the wide-band amplifier through a non-frequency sensitive voltage divider arrangement. The output of the difference amplifier is coupled directly to the output of the wide-band amplifier, so that the difference amplifier prevents the gain of the wide-band amplifier from decreasing at the lower applied signal frequencies.

In an alternative embodiment of the invention, the D.C. difference amplifier is effectively coupled in series circuit with the A.C. amplifier between the input and output of the wide-band amplifier. A D.C. shunt amplifier is arranged to shunt both the A.C. amplifier and the frequency responsive attenuating means, to provide the needed low frequency response. Again, the inputs of the D.C. difference amplifier are respectively coupled to the input and output of the wide-band amplifier through the aforementioned voltage divider, so that the difference amplifier is responsive to the gain of the wide-band amplifier. However, the output of the difference amplifier is coupled to the input of the A.C. amplifier and D.C. shunt amplifier to prevent the gain of the wide-band amplifier from decreasing at the lower applied signal frequencies.

Figure 1:
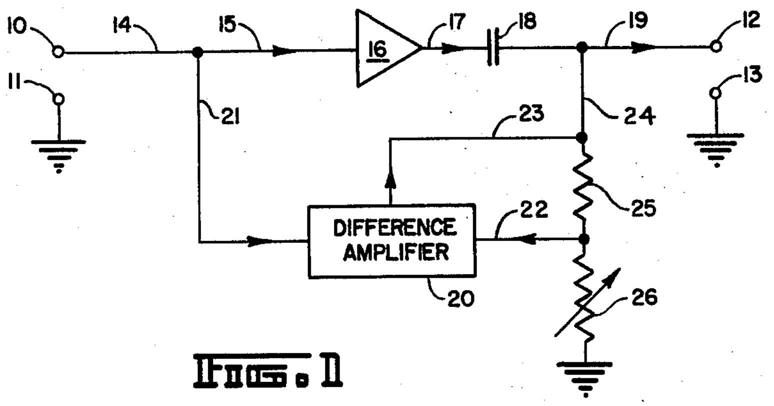
Fig. 1 is a schematic circuit diagram of a wide-band amplifier constructed in accordance with the teachings of the invention and constituting a preferred embodiment thereof.

Referring now to Fig. 1 of the drawing, there is shown a wide-band amplifier having input terminals 10 and 11 and output terminals 12 and 13. Input terminal 10 is coupled by leads 14 and 15 to an A.C. amplifier 16. Amplifier 16 may be any suitable A.C. amplifier, such as a conventional amplifier, distributed amplifier, or feedback amplifier. In designing the wide-band amplifier, the A.C. amplifier is selected to have a high frequency response which is the same as the high frequency response desired for the wide-band amplifier. The low frequency response of the A.C. amplifier may be any value which can be conveniently obtained. However, the frequency response characteristic of the A.C. amplifier should be flat between its high and low frequency limits, so that the gain of the amplifier is substantially constant for this range of frequencies. The output of the A.C. amplifier 16 is coupled by lead 17, capacitor 18 and lead 19 to the output terminal 12 of the wide-band amplifier.

A D.C. difference amplifier 20 is arranged to have one input coupled by leads 21 and 14 to the input terminal 10 of the wide-band amplifier, while the other input is coupled by a lead 22 to a voltage divider arrangement consisting of serially connected resistors 25 and 26. The output of the difference amplifier is coupled directly by leads 23, 24 and 19 to output terminal 12. The difference amplifier 20 may comprise any conventional D.C. amplifier which is adapted to produce an output signal which is a function of the difference between two applied input signals. For example, a suitable difference amplifier is described in paragraph 6–9 on page 113 of "Electron-Tube Circuits" by Seely, McGraw-Hill Book Co. Inc., 1950. The gain of the difference amplifier should be much greater than the gain of the A.C. amplifier over a range of signal frequencies extending from D.C. to the low frequency limit of the A.C. amplifier.

The design of the wide-band amplifier is such that A.C. amplifier 16 functions to amplify the high frequency signals applied to input terminal 10, with a substantially constant gain. The D.C. difference amplifier 20 functions to amplify the low frequency input signals to maintain the gain of the wide-band amplifier at a substantially constant value when the gain of the A.C. amplifier decreases. For this purpose, once the low frequency response of the A.C. amplifier is determined, capacitor 18 is chosen so that its reactance equals the impedance of difference amplifier 20 and the combination of the capacitor with resistors 25 and 26 begins to attenuate the output signals from the A.C. amplifier approximately a decade above the low frequency limit of the A.C. amplifier. The value of capacitor 18 is such that it offers a low impedance to the output signals from the A.C. amplifier 16 and a high impedance to the output signals from the difference amplifier 20. Resistors 25 and 26 are determined by making the ratio of the sum of the values of resistors 25 and 26 to the value of resistor 26 equal to the gain of A.C. amplifier 16. When this is done, the potential at the junction of resistors 25 and 26 will be equal to the potential at the input to amplifier 16, as long as the gain of the wide-band amplifier remains at a constant value, determined of course, by the gain of amplifier 16. As the applied signal frequency decreases, the frequency responsive voltage divider combination, formed by capacitor 18 and resistors 25, 26 acts to attenuate the output signals from amplifier 16, with the result that the gain of the wide-band amplifier begins to decrease and the potential at the junction of resistors 25 and 26 falls below its predetermined value. This causes the difference amplifier 20 to apply an output voltage to the output of the wide-band amplifier, sufficient to maintain a constant gain for the wide-band amplifier.

The operation of the circuit may best be understood by considering the situation where a step function voltage input is applied to input terminals 10 and 11. When the step voltage is applied, the sudden change in input voltage level is amplified quite satisfactorily by A.C. amplifier 16, so that no potential difference exists between the inputs to the D.C. difference amplifier 20. Therefore, A.C. amplifier 16 supplies all of the output voltage of the wide-band amplifier at this time. However, as capacitor 18 begins to discharge, the output voltage of the wide-band amplifier correspondingly decreases and the potential at the junction of resistors 25 and 26 also decreases. Since the gain of the difference amplifier is large, the output voltage can only drop a small amount before the output of the difference amplifier is sufficient to restore it to its correct value. Next, the output of the A.C. amplifier begins to fall. Since this decrease in output is at a relatively slow rate, capacitor 18 presents a high impedance to the resultant voltage change. Therefore, only a slightly greater decrease in voltage across resistor 26 will cause sufficient current to be supplied by the difference amplifier to charge capacitor 18 at the rate that the output of the A.C. amplifier is falling. Finally, when the output from the A.C. amplifier falls to zero, the D.C. difference amplifier supplies the entire output of the wide-band amplifier.

Although the D.C. difference amplifier 20 is a feedback amplifier, it cannot oscillate when it is connected to the A.C. amplifier 16. This is true, because at the high signal frequency where the phase shift of the D.C. amplifier would be 180°, the A.C. amplifier is supplying to the feedback loop of the D.C. amplifier a voltage of a phase and amplitude that causes negligible difference to exist between the two inputs to the D.C. amplifier. Since the difference amplifier produces no output voltage in the absence of a voltage difference between its inputs, there can be no possibility of oscillation. Even in the event that the A.C. amplifier fails, oscillation will not take place, because the difference amplifier is then operating into a very low impedance. Should the gain of the A.C. amplifier change with time, resistor 26 may be made variable, as illustrated, so that the potential value at the junction of resistors 25 and 26 may be correspondingly adjusted.

Figure 2:
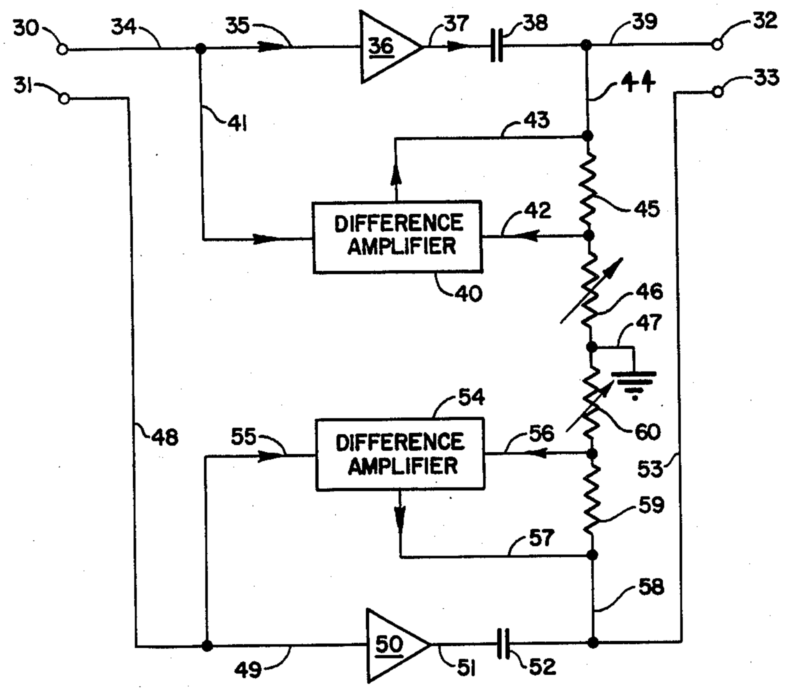
Fig. 2 is a schematic circuit diagram of a wide-band amplifier having a push-pull input and a push-pull output, the amplifier employing the embodiment of the invention of Fig. 1.

Fig. 2 of the drawing shows a wide-band push-pull amplifier having input terminals 30 and 31 and output terminals 32 and 33. This amplifier is suitable for the amplification of applied push-pull input signals and will supply push-pull output signals at the terminals 32, 33. Input terminal 30 is connected by leads 34 and 35 to an A.C. amplifier 36, corresponding to A.C. amplifier 16 in Fig. 1. The output of amplifier 36 is coupled by lead 37, capacitor 38, and lead 39 to the output terminal 32. A D.C. difference amplifier 40, corresponding to difference amplifier 20 in Fig. 1, has one input connected by leads 41 and 34 to input terminal 30 and the other input connected by lead 42 to the junction of voltage divider resistors 45 and 46. The output of the difference amplifier is connected by leads 43, 44 and 39 to the output terminal 32. A lead 47 grounds the voltage divider resistors and provides a reference point for push-pull operation. Input terminal 31 is connected by leads 48 and 49 to a second A.C. amplifier 50, which may be the same as amplifier 36. The output of amplifier 50 is coupled by lead 51, capacitor 52 and lead 53 to the output terminal 33. A second D.C. difference amplifier 54 has one input connected by leads 55 and 48 to input terminal 31 and the other input connected by lead 56 to the junction of voltage divider resistors 59 and 60. The output of the difference amplifier 54 is connected by leads 57, 58 and 53 to the output terminal 33.

The amplifier of Fig. 2 operates in the usual push-pull manner to amplify push-pull input signals. It may be noted however, that the wide-band amplifier shown in Fig. 1 is employed for both "sides" of the push-pull amplifier in a symmetrical arrangement. The circuit junction of the voltage dividers employed for each side of the amplifier is grounded by lead 47, so that a ground reference point is provided for the push-pull signals.

Each of the wide-band amplifiers operates in the same manner as the wide-band amplifier of Fig. 1.

Figure 3:
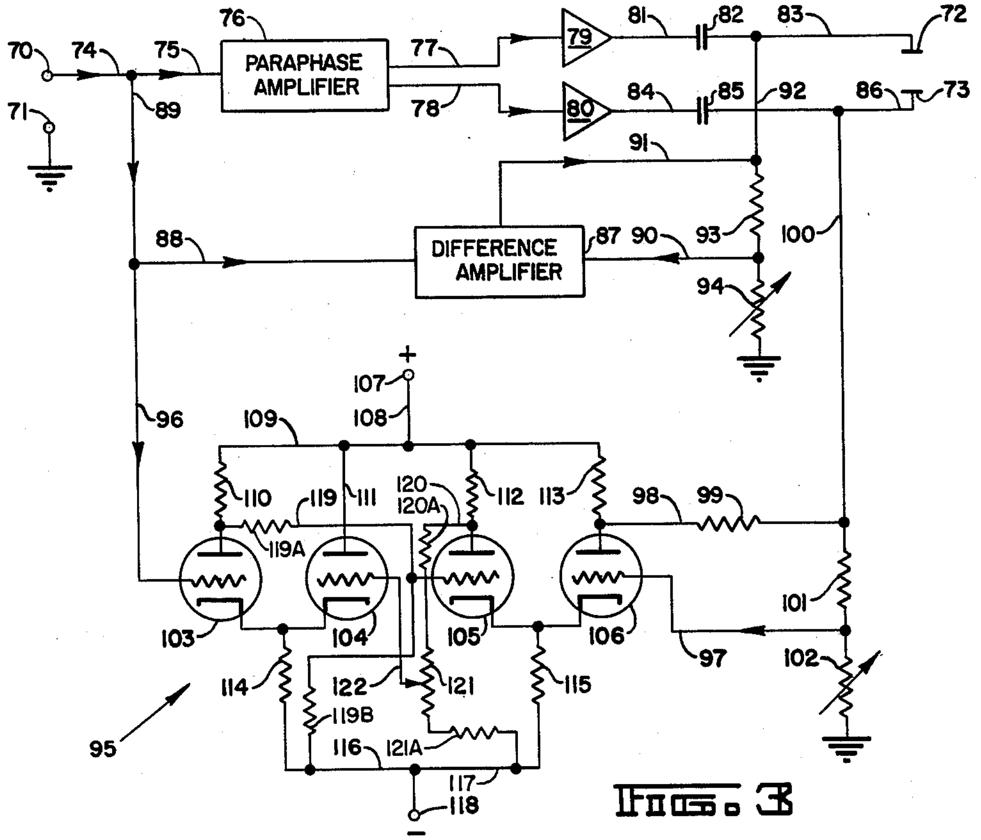
Fig. 3 is a schematic circuit diagram of a wide-band amplifier having a single input and a push-pull output, the amplifier employing the embodiment of the invention of Fig. 1.

Fig. 3 of the drawing shows how the wide-band amplifier of Fig. 1 may be applied to an amplifier having a push-pull output and a single input. Amplifiers of this type are commonly used as the deflection amplifiers in cathode-ray oscilloscopes. As shown in the drawing, input terminals 70 and 71 are adapted to receive single input signals, while the push-pull output of the amplifier is applied to a pair of deflecting plates 72 and 73 of a conventional cathode-ray tube (not shown). Input terminal 70 is connected by leads 74 and 75 to a conventional paraphase amplifier 76 such as shown, for example, in Figs. 9–28 on page 189 of "Electron-Tube Circuits" by Seely, McGraw-Hill Book Co., Inc., 1950. The paraphase amplifier functions to convert the single input at terminal 70 to a push-pull output. The push-pull output is then coupled by leads 77 and 78 to respective A.C. amplifiers 79 and 80, which may be the same as amplifiers 36 and 50 in the amplifier of Fig. 2. The output of amplifier 79 is coupled by lead 81, capacitor 82, and lead 83 to deflection plate 72. Similarly, the output of amplifier 80 is coupled by lead 84, capacitor 85, and lead 86 to deflection plate 73, so that push-pull signals are applied to the deflection plates of the oscilloscope in the usual manner.

A D.C. difference amplifier 87, which may be the same as difference amplifiers 40 and 54 in the circuit of Fig. 2, has one input coupled to input terminal 70 by leads 88, 89 and 74. The other input of the difference amplifier is coupled by lead 90 to the circuit junction of voltage divider resistors 93 and 94. Leads 91, 92 and 83 serve to connect the output of the difference amplifier to deflection plate 72. A second D.C. difference amplifier, indicated generally as 95, has one input connected by leads 96, 89 and 74 to the input terminal 70 and the other input connected by lead 97 to the circuit junction of voltage divider resistors 101 and 102. The output of this difference amplifier is coupled by lead 98, resistor 99, lead 100 and lead 86 to deflection plate 73. Difference amplifier 95 differs somewhat from difference amplifier 87 in that it must provide a 180° phase reversal in addition to its normal difference amplifier functions. This is necessary because the output signals from the two D.C. difference amplifiers must be 180° out of phase with respect to each other, since they are applied to a push-pull amplifier circuit. Furthermore, both difference amplifiers have one input which is connected to the same input terminal of the deflection amplifier. Accordingly, difference amplifier 95 will now be described in detail.

As seen in Fig. 3, difference amplifier 95 comprises triodes 103, 104, 105 and 106. A terminal 107, which is connected to a source (not shown) of positive plate supply voltage, is also connected by leads 108 and 109 and a plate resistor 110 to the plate of triode 103. The plate of triode 104 is connected by leads 111, 109 and 108 to the same terminal. Similarly, the plates of triodes 105 and 106 are connected by plate resistors 112 and 113 to the source of plate supply voltage. The cathodes of tubes 103 and 104 are connected together and to a common cathode coupling resistor 114. Triodes 105 and 106 also have their cathodes coupled together and to a common cathode coupling resistor 115. Leads 116 and 117 serve to connect the cathode coupling resistors together and to a terminal 118, which is connected to a source (not shown) of negative plate supply voltage, A lead 119 and resistors 119A and 119B are arranged to connect the plate of triode 103 to the grid of triode 105, while a lead 120, a variable resistor 121, resistors 120A and 121A, and a lead 122 provide an input for the grid of triode 104.

The operation of the difference amplifier 95 may be explained by noting that triodes 103 and 104 act as a phase reversal amplifier, to provide an output signal at the plate of triode 103, which is 180° out of phase with respect to the signal applied to the grid of triode 103. Accordingly, the output of the two triodes 103 and 104, which is applied to the grid of tube 105 by lead 119 and resistors 119A, 119B, is merely the signal from input terminal 70, reversed in phase by 180°. Triodes 105 and 106 function in the usual manner of a difference amplifier, so that the output signal at lead 98 is the difference between the signals applied to the grids of tubes 105 and 106.

Figure 4:
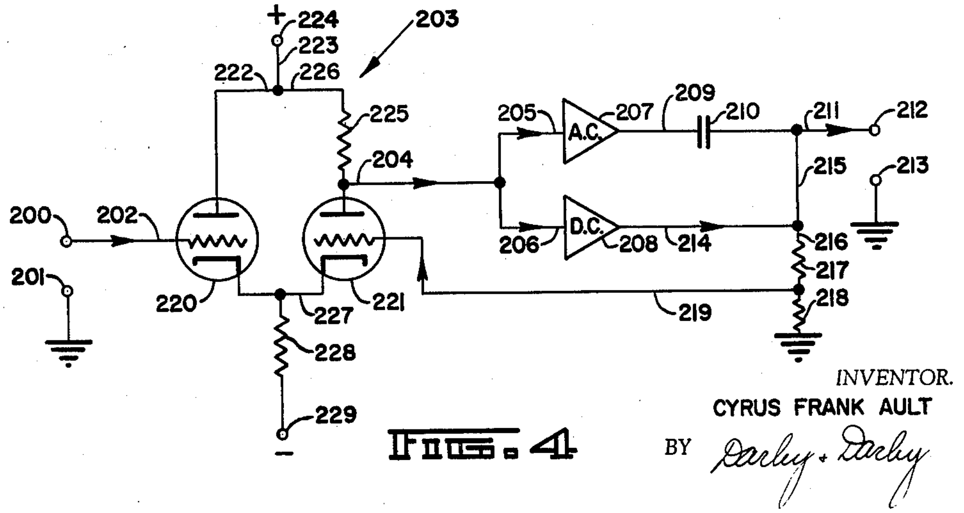
Fig. 4 is a schematic circuit diagram of a wide-band amplifier constituting an alternative embodiment of the invention.

Fig. 4 of the drawing shows an alternative embodiment of the invention in which the D.C. difference amplifier is effectively connected in series circuit with the A.C. amplifier between the input and output of the wide-band amplifier. As seen therein, the wide-band amplifier has input terminals 200 and 201 and output terminals 212 and 213. Input terminal 200 is connected by lead 202 to a D.C. difference amplifier, indicated generally as 203. The output of the difference amplifier is applied by a lead 204 and leads 205, 206 to the input of an A.C. amplifier 207 and a D.C. amplifier 208. The A.C. amplifier 207 may be the same as amplifier 16 in the embodiment of Fig. 1 of the drawing. Amplifier 208 however, functions as a D.C. coupling amplifier and need only have the required low frequency response characteristic. The output of A.C. amplifier 207 is coupled by lead 209, capacitor 210, and lead 211 to the output terminal 212. Leads 214 and 215 couple the output of D.C. amplifier 208 to the same terminal, so that amplifier 208 shunts A.C. amplifier 207 and capacitor 210. Leads 215 and 216 connect the output of the two amplifiers to ground through voltage divider resistors 217 and 218. The circuit junction of these two resistors is connected to the other input of the difference amplifier 203 by a lead 219.

Returning again to the difference amplifier 203, it is seen that it comprises a pair of triodes 220 and 221. Triode 220 has its plate connected to a terminal 224 by leads 222 and 223. The terminal 224 is connected to a source (not shown) of positive plate supply voltage. Triode 221 has its plate connected to the same terminal by a plate resistor 225 and leads 226, 223. The cathodes of the triodes are coupled together by a lead 227. A common cathode coupling resistor 228 connects both cathodes to a terminal 229 which is connected to a source (not shown) of negative plate supply voltage. The operation of difference amplifier 203 is well known and provides an output at lead 204, which is a function of the difference between the signals applied to the grids of triodes 220 and 221.

This embodiment of the invention is suitable for applications where the high frequency response requirements of the wide-band amplifier are not too severe. Basically, the difference amplifier 203 functions to maintain a constant gain for the wide-band amplifier over a range of applied signal frequencies determined by the frequency response characteristics of A.C. amplifier 207 and D.C. amplifier 208. Again, as the output from A.C. amplifier 207 falls with decreasing frequency, due to the action of the frequency responsive voltage divider, the potential at the junction of resistors 217 and 218 will decrease and the difference amplifier 203 will provide a correspondingly greater output to restore the gain of the wide-band amplifier to its original value. The gains of both the A.C. and D.C. amplifiers should be made high in the overlapping region of operation and in the region wherein each amplifier is contributing the major portion of the output.

As many changes could be made in the above apparatus and many apparently widely different embodiments of the invention constructed, without departing from the scope thereof, it is intended that all matter contained in the above description or shown in the accompanying drawings shall be interpreted as illustrative and not in a limited sense.

What is claimed is:

1. In a wide-band amplifier having an input and an output, the combination comprising a first amplifier coupled between said input and output, said first amplifier having a flat frequency response characteristic over a first range of applied signal frequencies; frequency responsive attenuating means included in the coupling between said first amplifier and said output, said attenuating means being operable to attenuate the output signals from said first amplifier for signal frequencies lower than a frequency lying in said first range of frequencies near the low frequency limit thereof; and means for causing the wide-band amplifier to have a flat frequency response characteristic over a wider range of applied signal frequencies than said first range, said last-named means including a difference amplifier having two inputs and an output, one of said inputs being coupled to the input of the wide-band amplifier and the other of said inputs being coupled to the output of the wide-band amplifier through signal attenuating means, so that said difference amplifier is adapted to produce output signals in response to the gain of the wide-band amplifier.

2. Apparatus as claimed in claim 1, wherein the output of said difference amplifier is coupled directly to the output of the wide-band amplifier, so that the difference amplifier is effectively in parallel circuit with said first amplifier between the input and output of the wide-band amplifier.

3. Apparatus as claimed in claim 1, wherein said frequency responsive attenuating means comprises a capacitor in series circuit with said first amplifier and a resistance shunted across the output of the wide-band amplifier.

4. Apparatus as claimed in claim 3, wherein said other input of the difference amplifier is coupled across a portion of said resistance, so that said resistance functions as said signal attenuating means to supply a portion of the output signals from the wide-band amplifier to said other input of the difference amplifier.

5. Apparatus as claimed in claim 4, wherein the output of said difference amplifier is coupled directly to the circuit junction of said capacitor and said resistance, so that the difference amplifier is effectively in parallel circuit with said first amplifier between the input and output of the wide-band amplifier.

6. Apparatus as claimed in claim 3, wherein said resistance comprises serially connected first and second resistors, said other input of said difference amplifier being coupled to the circuit junction of the resistors, so that said resistors function as a voltage divider to supply a portion of the output voltage from the wide-band amplifier to said other input of the difference amplifier.

7. Apparatus as claimed in claim 6, wherein the ratio of the sum of the values of said first and second resistors to the value of said second resistor is equal to the voltage gain of said A.C. amplifier over said first range of frequencies, the output of said D.C. difference amplifier being coupled directly to the circuit junction of said capacitor and said serially connected resistors, so that the difference amplifier is effectively in parallel circuit with said A.C. amplifier between the input and output of the wide-band amplifier.

8. In a wide-band amplifier having a push-pull input and a push-pull output, the combination comprising a pair of A.C. amplifiers coupled in push-pull circuit between said input and output, each of said A.C. amplifiers having a flat frequency response characteristic over a first range of applied voltage signal frequencies; a pair of frequency responsive voltage dividers included in the coupling between said A.C. amplifiers and said output, each of said voltage dividers comprising a capacitor in series circuit with the A.C. amplifier associated therewith and serially connected first and second resistors shunted across the output of the wide-band amplifier associated with the A.C. amplifier, said voltage dividers each being operable to attenuate the output voltage from the A.C. amplifier associated therewith for signal frequencies lower than a frequency lying in said first range of frequencies near the low frequency limit thereof; and a pair of D.C. difference amplifiers each having two inputs and an output, one of said inputs being coupled to the input of the wide-band amplifier for the A.C. amplifier associated therewith and the other of said inputs being coupled to the circuit junction of said first and second resistors, so that the difference amplifier is responsive to the voltage gain of the wide-band amplifier, the output of the difference amplifier being coupled directly to the circuit junction of said capacitor and said serially connected resistors, each of said D.C. difference amplifiers having a much greater voltage gain than said A.C. amplifiers over a second range of applied voltage signal frequencies extending from D.C. to the low frequency limit of said first range, whereby the wide-band amplifier has a flat frequency response characteristic over a range of applied signal frequencies extending from D.C. to the high frequency limit of said first range.

9. Apparatus as claimed in claim 8, wherein the ratio of the sum of the values of said first and second resistors to the value of said second resistor is equal to the voltage gain of said A.C. amplifiers over said first range of applied signal frequencies.

10. In a wide-band amplifier having a single input and a push-pull output, the combination comprising a paraphase amplifier having a single input and a push-pull output, the input of said paraphase amplifier being coupled to the input of the wide-band amplifier; a pair of A.C. amplifiers coupled in push-pull circuit between the output of the paraphase amplifier and the output of the wide-band amplifier, each of said A.C. amplifiers having a flat frequency response characteristic over a first range of applied voltage signal frequencies; a pair of frequency responsive voltage dividers included in the coupling between said A.C. amplifiers and the output of the wide-band amplifier, each of said voltage dividers comprising a capacitor in series circuit with the A.C. amplifier associated therewith and serially connected first and second resistors shunted across the output of the wide-band amplifier associated with the A.C. amplifier, said voltage dividers each being operable to attenuate the output voltage from the A.C. amplifier associated therewith for signal frequencies lower than a frequency lying in said first range of frequencies near the low frequency limit thereof; and a pair of D.C. difference amplifiers each having two inputs and an output, one of said inputs being coupled to the input of the wide-band amplifier and the other of said inputs being coupled to the circuit junction of said first and second resistors, so that the difference amplifier is responsive to the voltage gain of the wide-band amplifier, the output of the difference amplifier being coupled directly to the circuit junction of said capacitor and said serially connected resistors, each of said D.C. difference amplifiers having a much greater voltage gain than said A.C. amplifiers over a second range of applied voltage signal frequencies extending from D.C. to the low frequency limit of said first range, whereby the wide-band amplifier has a flat frequency response characteristic over a range of applied signal frequencies extending from D.C. to the high frequency limit of said first range.

11. Apparatus as claimed in claim 10, wherein the ratio of the sum of the values of said first and second resistors to the value of said second resistor is equal to the voltage gain of the wide-band amplifier over said first range of applied signal frequencies.

References Cited in the file of this patent

UNITED STATES PATENTS

| | | |
|---|---|---|
| 2,252,612 | Bingley | Aug. 12, 1941 |
| 2,256,512 | Artzt | Sept. 23, 1941 |
| 2,760,011 | Berry | Aug. 21, 1956 |
| 2,781,423 | Kuczun et al. | Feb. 12, 1957 |